US007095347B2

(12) United States Patent
Hirata et al.

(10) Patent No.: US 7,095,347 B2
(45) Date of Patent: Aug. 22, 2006

(54) DIGITALLY TRIMMED DAC CELL

(75) Inventors: Erick M. Hirata, Torrance, CA (US); Roger N. Kosaka, Torrance, CA (US); Christopher B. Langit, Gardena, CA (US); Lloyd F. Linder, Agoura Hills, CA (US)

(73) Assignee: TelASIC Communication, Inc., El Segundo, CA (US)

( * ) Notice: Subject to any disclaimer, the term of this patent is extended or adjusted under 35 U.S.C. 154(b) by 279 days.

(21) Appl. No.: 10/715,262

(22) Filed: Nov. 17, 2003

(65) Prior Publication Data

US 2004/0257058 A1 Dec. 23, 2004

Related U.S. Application Data

(60) Provisional application No. 60/480,106, filed on Jun. 20, 2003.

(51) Int. Cl.
*H03M 1/66* (2006.01)

(52) U.S. Cl. ........................ 341/144; 341/153; 341/154

(58) Field of Classification Search ......... 341/118–121, 341/144, 153, 154

See application file for complete search history.

(56) References Cited

U.S. PATENT DOCUMENTS

| | | | | |
|---|---|---|---|---|
| 4,899,152 | A * | 2/1990 | Barrow et al. | 341/154 |
| 5,012,178 | A * | 4/1991 | Weiss et al. | 323/269 |
| 5,585,751 | A * | 12/1996 | Iizuka | 327/113 |
| 5,612,696 | A * | 3/1997 | Kim | 341/136 |
| 5,870,049 | A * | 2/1999 | Huang et al. | 341/144 |
| 6,072,415 | A * | 6/2000 | Cheng | 341/144 |
| 6,198,418 | B1 * | 3/2001 | Ishizuka | 341/144 |
| 6,329,940 | B1 * | 12/2001 | Dedic | 341/144 |
| 6,337,648 | B1 * | 1/2002 | Kiriaki | 341/154 |
| 6,583,744 | B1 * | 6/2003 | Bright | 341/145 |
| 6,831,580 | B1 * | 12/2004 | Bae | 341/144 |

* cited by examiner

*Primary Examiner*—Linh Van Nguyen
(74) *Attorney, Agent, or Firm*—Morrison & Foerster LLP

(57) ABSTRACT

A digitally trimmed current source. The novel current source includes a first circuit for generating a current in response to an applied voltage and a resistance variable in response to a control signal, and a second circuit for supplying the control signal. The first circuit includes a resistive network comprised of a plurality of resistors; a plurality of switches, each switch coupled to one of the resistors and adapted to selectively switch the resistor in and out of the resistive network in response to the control signal; and a transistor adapted to apply a voltage across the resistive network to generate a current.

29 Claims, 4 Drawing Sheets

DIGITALLY TRIMMED DAC CELL

CROSS-REFERENCE TO RELATED APPLICATIONS

This application claims the benefit of U.S. Provisional Application No. 60/480,106, filed Jun. 20, 2003, the disclosure of which is hereby incorporated by reference.

BACKGROUND OF THE INVENTION

1. Field of the Invention

The present invention relates to electronics. More specifically, the present invention relates to digital to analog converters.

2. Description of the Related Art

Digital to analog converters are widely used for converting digital signals to corresponding analog signals for many electronic circuits. For example, a high resolution, high speed digital to analog converter (DAC) may find application in video circuits, high quality audio, instrumentation applications, and in the transmit path for high dynamic range communications applications. It may also be used in high speed analog to digital converters (ADCs) that utilize DACs such as successive approximation ADCs or subranging ADCs.

A common type of DAC, the current summing DAC, generates an analog output signal by selectively switching a number of current sources (or cells) into or out of a current summing device in response to a digital input signal. Because of process variables, the multiple current sources required by the DAC cannot be fabricated to exact values. In fact, current sources can vary from one to the next, even on the same die. These inaccuracies result in distortions in the analog output signal. The current sources therefore need to be trimmed to meet the accuracy requirements of the DAC. They can be trimmed to equal one another (unary DACs) or to provide currents with binary weights (binary DACs).

The prior art accomplished this trimming in various ways. The most straightforward method used is to trim the current setting resistors of the current sources with a laser, in effect changing the value of the resistor chain by burning material off to raise the resistance. This technique has several problems. One significant problem is that an expensive trimming laser system must be used. In addition, this process can only be done prior to packaging and therefore will not be able to correct for any post-trim stresses the chip might encounter during cleaning, packaging and sealing. Because the resistors are subject to change when stressed, they must be placed on the chip in locations that will minimize the stress they experience. This impacts and limits the IC layout. There are also issues with time since the trim process must be approached linearly (i.e., a binary search cannot be used). This, of course, adds costs to the device. Furthermore, any mistakes made by the laser trimming process cannot be done. If too much of a resistor is trimmed off, all of the resistors will need to be retrimmed.

There are other approaches that allow for resistor trimming, but they generally require significant pad areas because of the high voltages and/or currents required to blow fuse links. These restrictions limit the number of corrections that can be made, thereby limiting the overall resolution or dynamic range of the DAC.

Another approach is to add a second variable current source to each cell to make the total steered current correct to the accuracy required. The variable current source can be trimmed over a small range of current to allow for the required adjustment to be made. For each current source to be adjusted (and there are typically several), an extra node is connected to each current summing bus. This extra loading on the current bus will impact the settling time of the DAC and slow down its operating speed. This is not acceptable in many applications.

Hence, there is a need in the art for an improved system or method for trimming current sources in digital to analog converters that overcomes the shortcomings of prior art approaches.

SUMMARY OF THE INVENTION

The need in the art is addressed by the digitally trimmed current source of the present invention. The novel current source includes a first circuit for generating a current in response to an applied voltage and a resistance variable in response to a control signal, and a second circuit for supplying the control signal. The first circuit includes a resistive network comprised of a plurality of resistors; a plurality of switches, each switch coupled to one of the resistors and adapted to selectively switch the resistor in and out of the resistive network in response to the control signal; and a transistor adapted to apply a voltage across the resistive network to generate a current. In an alternative embodiment, the current source includes two resistors connected in series, a mechanism for applying a voltage across the resistors to generate a current, and a digital to analog converter adapted to apply a voltage or current at the node between the two resistors to change the current in response to a control signal.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
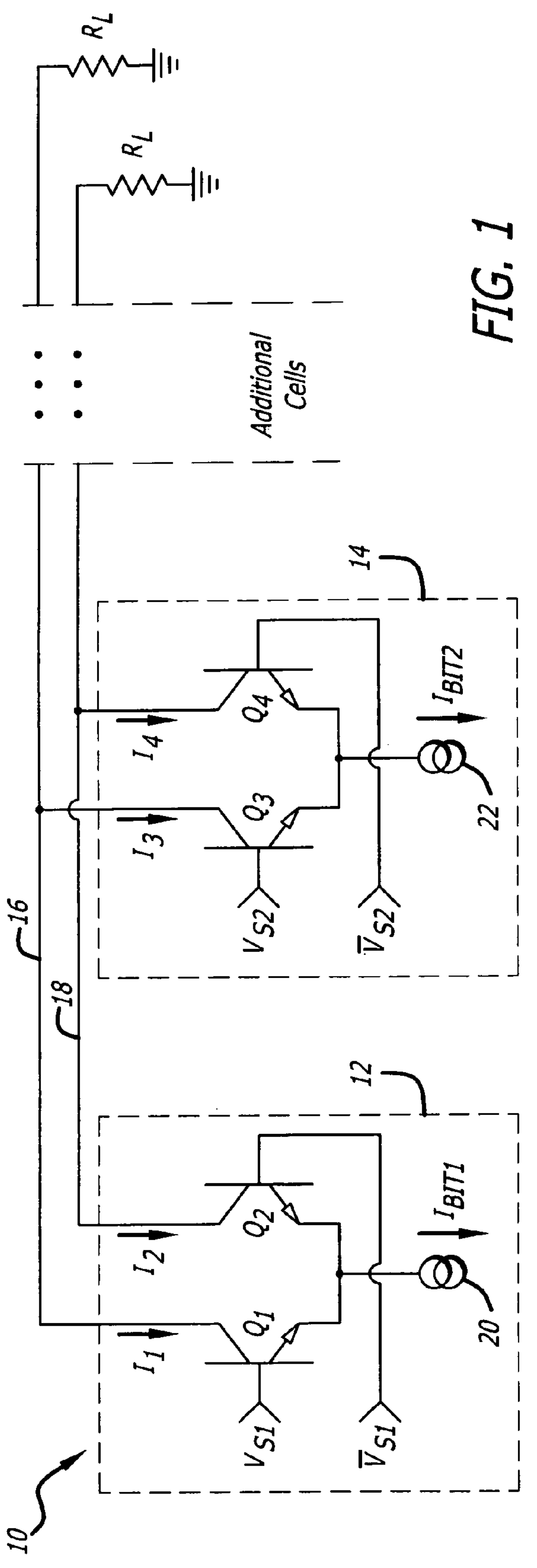
FIG. 1 is a schematic of a common implementation of an integrated circuit DAC.

FIG. 1 is a simplified schematic of a common implementation of an integrated circuit DAC 10. Two of N current steering cells 12 and 14 are shown in the figure. In practice there will be several more cells. The number of cells N depends on the desired resolution of the DAC. Each cell 12, 14 selectively switches current between a first current summing bus 16 and a second current summing bus 18 in response to an N-bit digital input signal. For example, the first cell 12 is controlled by a signal $V_{S1}$, representing the least significant bit (LSB) of the N-bit digital word, and the next cell 14 is controlled by a signal $V_{S2}$, representing the next LSB. Each current summing bus 16, 18 is connected to ground through a load resistance $R_L$. The analog output of the DAC 10 is taken from the voltage difference between the two busses 16 and 18.

Each current cell 12 and 14 includes a pair of steering switches (Q1, Q2 in the first cell 12, and Q3, Q4 in the second cell 14) coupled to a current source 20 and 22, respectively. As shown in FIG. 1, the collector of Q1 is connected to the first bus 16 drawing a current $I_1$, the base of Q1 is connected to $V_{S1}$, and the emitter of Q1 is connected in common with the emitter of Q2 to the current source 20, which generates a current $I_{BIT1}$. The collector of Q2 is connected to the second bus 18 drawing a current $I_2$, and the base of Q2 is connected to $\overline{V}_{S1}$, where $\overline{V}_{S1}$ is the complement of $V_{S1}$. Similarly, for the second cell 14, the collector of Q3 is connected to the first bus 16 drawing a current $I_3$, the base of Q3 is connected to $V_{S2}$, and the emitter of Q3 is connected in common with the emitter of Q4 to the current source 22, which generates a current $I_{BIT2}$. The collector of Q4 is connected to the second bus 18, drawing a current $I_4$, and the base of Q4 is connected to $\overline{V}_{S2}$, where $\overline{V}_{S2}$ is the complement of $V_{S2}$.

The function of the switches Q1 and Q2 is to steer the current $I_{BIT1}$ out of either the first bus 16 or the second bus 18 depending on the digital code input to the pair. For example, if $V_{S1}$ was positive with respect to $\overline{V}_{S1}$, then Q1 would be turned on and Q2 off. Therefore, $I_1=I_{BIT1}$ and $I_2=0$. If $V_{S1}$ was negative with respect to $\overline{V}_{S1}$, then Q1 would be turned off and Q2 on, resulting in $I_1=0$ and $I_2=I_{BIT1}$. The second pair of transistors, Q3 and Q4, will function the same way in response to the code $V_{S2}$.

The current sources in the cells are either equal (for a unary DAC) or binarily weighted (for a binary DAC). Thus, the current $I_{BIT1}$ can equal $I_{BIT2}$ for a unary weighted DAC, or $I_{BIT1}$ can equal $I_{BIT2}/2$ or $2I_{BIT2}$ for a binary weighted DAC. In either case, the current sources must be trimmed to an accuracy commensurate with the overall accuracy intended for the DAC. In some cases, this can be to accuracies approaching 0.001% of the desired current. Since the fabrication variability will often only match the current sources to about 1%, some method is needed to trim the current sources so that the required accuracies will be met.

Figure 2:
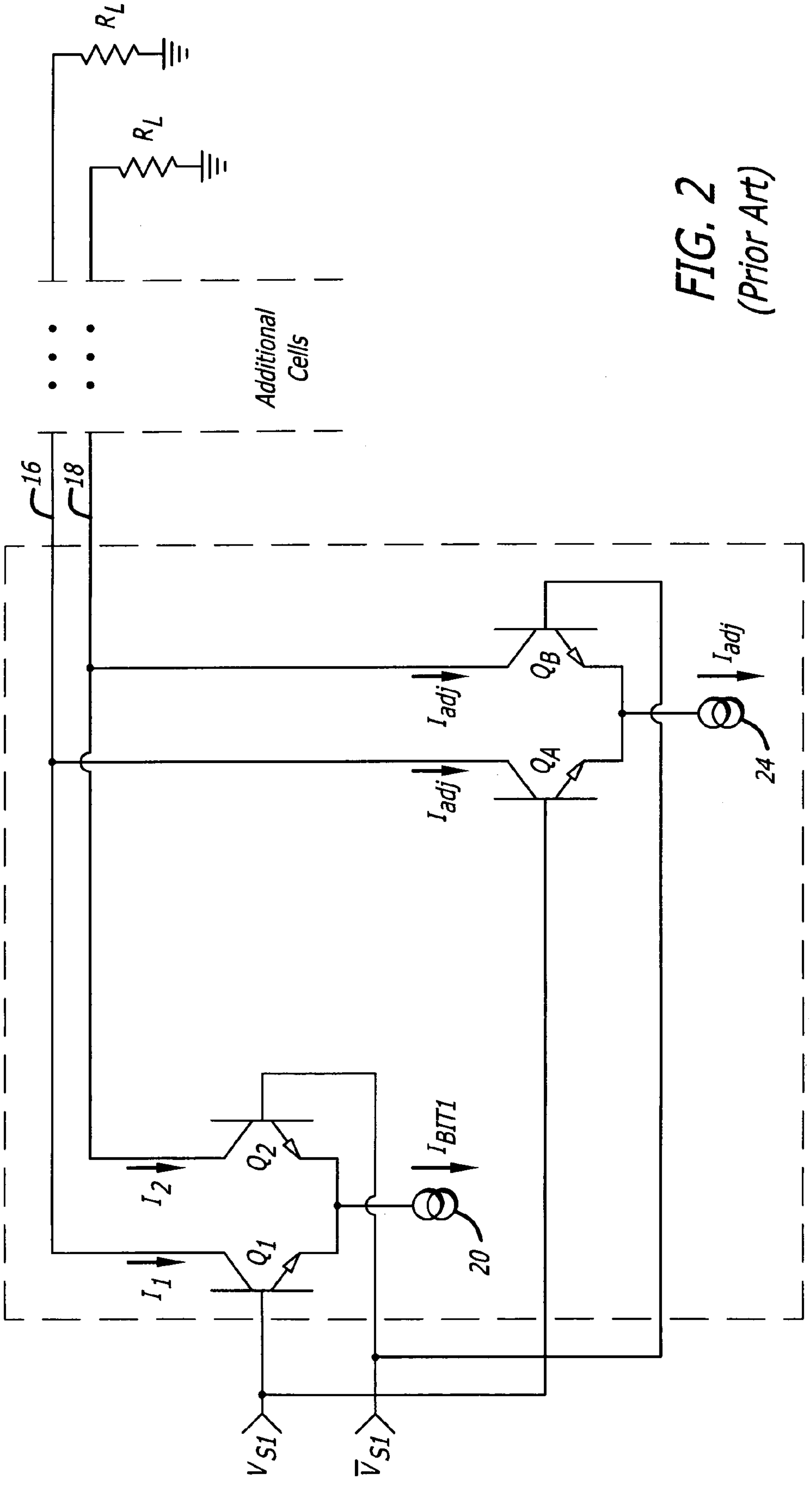
FIG. 2 (Prior Art)
FIG. 2 is a schematic of a current steering cell that implements a conventional method for trimming currents in a DAC.

One method is to add a variable current source to each current steering cell to make the total current steered correct to the accuracy required. FIG. 2 is a schematic of a current steering cell 12' that implements this approach. In addition to the components of the cell 12 as shown in FIG. 1, the trimmable cell 12' includes a second current source 24, which generates a current $I_{adj}$ that is switched out of either the first bus 16 or the second bus 18 by transistors $Q_A$ and $Q_B$, respectively, which are controlled by $V_{S1}$ and. $\overline{V}_{S1}$, respectively. $V_{S1}$ therefore controls not only Q1 and Q2 but also $Q_A$ and $Q_B$. The current $I_{adj}$ can be made so that it can be trimmed over a small range of current to allow for the required adjustment to be made on $I_{BIT1}$. As mentioned above, this approach has a major shortcoming. Since there are multiple current steering cells that require trimming, the additional variable current sources add loads on the current summing busses, thereby slowing down the DAC's settling time. Another method for trimming the currents in a DAC involves trimming the current setting resistors of the current sources in each cell.

Figure 3:
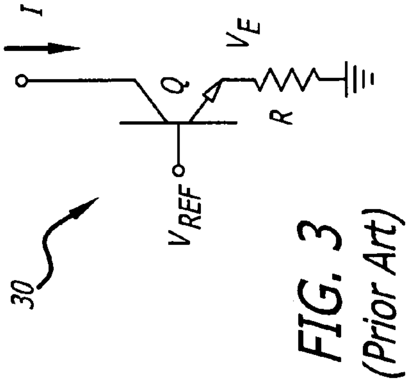
FIG. 3 (Prior Art)
FIG. 3 is a schematic of a simplified current source.

FIG. 3 is a schematic of a simplified current source 30, comprised of a transistor Q having a reference voltage $V_{REF}$ applied to its base, drawing a current I through its collector, and having a voltage $V_E$ at its emitter; and a resistor R connected between the emitter of Q and ground. The current $I=V_E/R$. (The contribution of base current to $V_E/R$ is ignored since it is not germane to this discussion.) The current I can therefore be varied by varying the resistance R. In practice, the necessary change to R is small compared to its nominal target value so the implementation often looks like FIG. 4.

Figure 4:
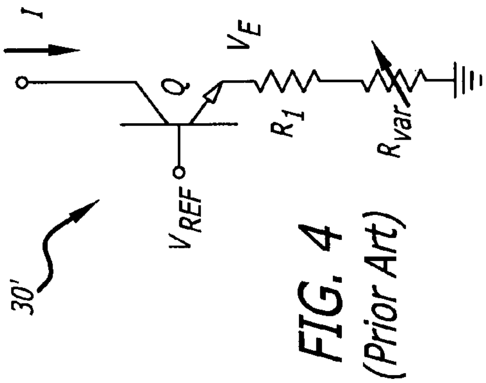
FIG. 4 (Prior Art)
FIG. 4 is a schematic of a simplified current source having a trimmable resistor.

FIG. 4 is a schematic of a simplified current source 30' having a trimmable resistor. In this implementation, the resistor R (of FIG. 3) is replaced by a fixed resistor R1 and a trimmable resistor $R_{var}$. $R_{var}$ is much smaller in value than R1 (10% of R1 would be reasonable). Since $I=V_E/(R_1+R_{var})$, by trimming $R_{var}$, higher accuracy (resolution) can be achieved during the trim process. The trim range needs only to be as large as the process variations require. $R_{var}$ is typically trimmed using a laser.

This technique, however, has several problems. One significant problem is that an expensive trimming laser system must typically be used. In addition, this process can typically only be done prior to packaging and therefore will not be able to correct for any post-trim stresses the chip might encounter during cleaning, packaging and sealing. Because the resistors are subject to change when stressed, they must generally be placed on the chip in locations that will minimize the stress they experience. This impacts and limits the IC layout. There are also issues with time since the trim process must be approached linearly (i.e., a binary search cannot be used). This, of course, adds costs to the device.

There are other approaches that allow for resistor trimming, but they generally require significant pad areas because of the high voltages and/or currents required to blow fuse links. These restrictions limit the number of corrections that can be made, thereby limiting the overall resolution or dynamic range of the DAC.

Figure 5:
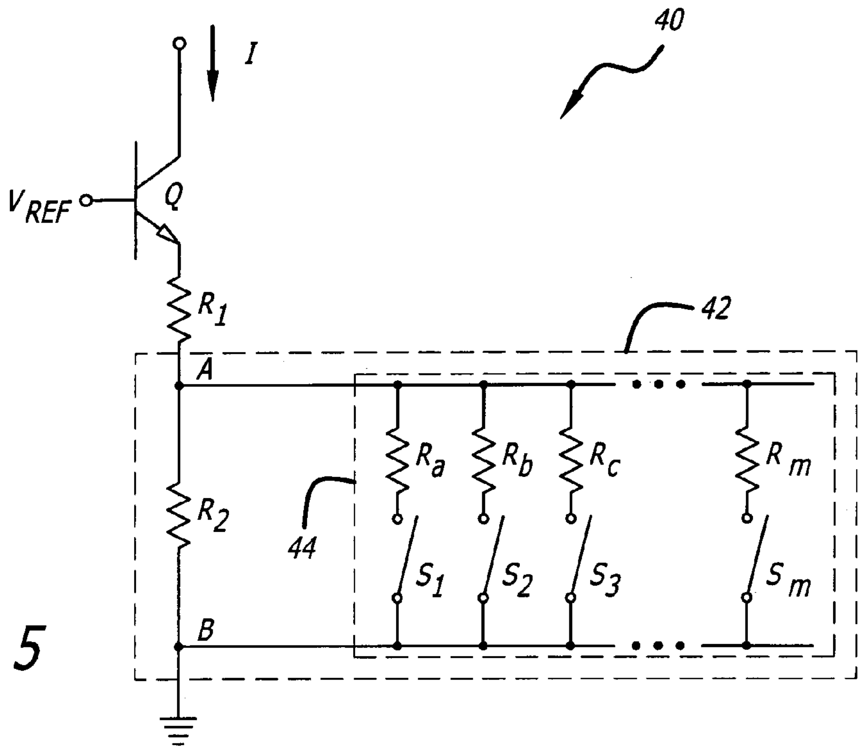
FIG. 5 is a schematic of a trimmable current source designed in accordance with an illustrative embodiment of the teachings of the present invention.

The present invention accomplishes the trimming of the resistor, $R_{var}$, in an entirely different fashion. FIG. 5 is a schematic of a trimmable current source 40 designed in accordance with an illustrative embodiment of the teachings of the present invention. As shown in FIG. 5, the variable resistor. $R_{var}$ of FIG. 4 is replaced with a resistive network 42 comprised of a bank 44 of resistors connected in parallel to a resistor R2, which is connected between R1 and ground at nodes A and B, respectively. The resistor bank 44 includes a plurality of resistors ($R_a$, $R_b$, $R_c$, . . . , $R_m$) connected in parallel between nodes A and B, and a plurality of switches ($S_1$, $S_2$, $S_3$, . . . , $S_m$), each switch coupled to one of the resistors ($R_a$, $R_b$, . . . , $R_m$, respectively). The resistors ($R_a$, $R_b$, $R_c$, . . . , $R_m$) of the bank 44 can thus be selectively switched in and out of the resistive network 42 by the switch ($S_1$, $S_2$, $S_3$, . . . , $S_m$, respectively) in response to a control signal.

The value $R_{EQ}$ of the resistive network 42 when all the switches are closed is given by:

$$R_{EQ} = \frac{1}{\frac{1}{R2} + \frac{1}{Ra} + \frac{1}{Rb} + \frac{1}{Rc} + \ldots + \frac{1}{Rm}} \quad [1]$$

If, however, as an example, only $S_2$ was closed and all other switches were open, then $R_{EQ}$ would be given by $$R_{EQ} = \frac{1}{\frac{1}{R2} + \frac{1}{Rb}}.$$

Thus, the current I generated by the current source 40 can be adjusted or trimmed by adjusting the resistance $R_{EQ}$ of a resistive network 42 through the selective switching of resistors ($R_a$, $R_b$, . . . , $R_m$) in and out of the resistive network 42.

If the resistors $R_a$, $R_b$, $R_c$, . . . , $R_m$ are binarily weighted resistors, then $R_{EQ}$ could be trimmed to a value with resolution equal to the number of switches ($S_1$, $S_2$, . . . , $S_m$) and resistors ($R_a$, $R_b$, . . . , $R_m$). The resistors however do not have to be binarily weighted. The key feature is that the resultant trim be monotonic. The process technology will affect the weights.

Figure 6:
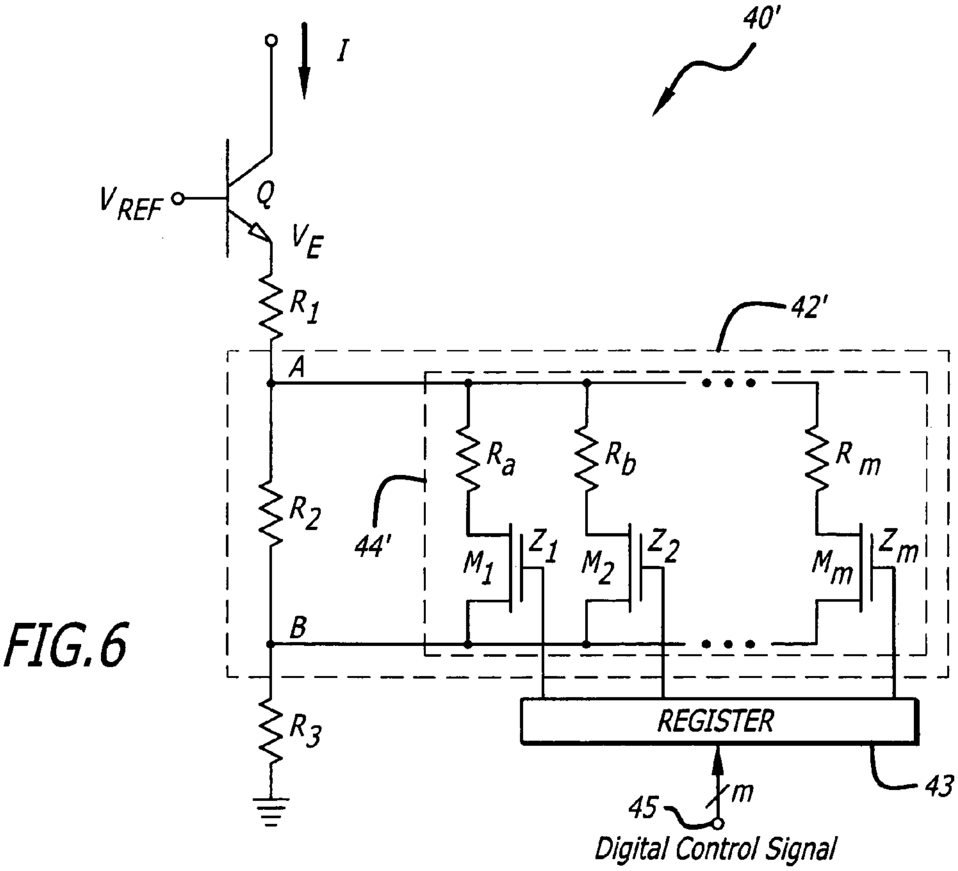
FIG. 6 is a schematic of an implementation of a trimmable current source designed in accordance with an illustrative embodiment of the teachings of the present invention.

FIG. 6 is a schematic of one implementation of a trimmable current source 40' designed in accordance with an illustrative embodiment of the teachings of the present invention. The current source 40' includes a transistor Q that draws a current I at its collector, which, in a current steering cell 12 of a DAC 10 such as that shown in FIG. 1, would be coupled to the current steering switches (Q1, Q2). A reference voltage. $V_{REF}$ is applied to the base of Q, generating a voltage $V_E$ at the emitter. The emitter of Q is connected to a resistor R1, which is connected in series to a resistive network 42' at a node A. The resistive network 42' is connected to a resistor R3 at a node B, and the other end of R3 is connected to ground.

The resistive network 42' includes a bank of resistors 44' connected in parallel to a resistor R2 between the nodes A and B. The resistor bank 44' includes a plurality of resistors ($R_a$, $R_b$, $R_c$, . . . , $R_m$) connected in parallel between nodes A and B, and a plurality of switches ($M_1$, $M_2$, $M_3$, . . . , $M_m$), each switch coupled to one of the resistors ($R_a$, $R_b$, . . . , $R_m$, respectively). The switches ($M_1$, $M_2$, . . . , $M_m$) selectively switch the resistors ($R_a$, $R_b$, . . . , $R_m$) in and out of the resistive network 42' in accordance with control signals ($Z_a$, $Z_b$, . . . , $Z_m$) applied to the gates of the transistors ($M_1$, $M_2$, . . . , $M_m$). In this embodiment, the switches ($M_1$, $M_2$, . . . , $M_m$) are implemented using CMOS (specifically NMOS) switches. The invention, however, is not limited thereto. Other process technologies can be used without departing from the scope of the present teachings.

The NMOS switches ($M_1$, $M_2$, . . . , $M_m$) can be controlled in a variety of ways. For example, a serial register 43 can be used to supply the control signals ($Z_a$, $Z_b$, . . . , $Z_m$). Digital words for manipulating the switches can be loaded into the register 43 via a serial port 45. The switches can then be adjusted until the current is at the desired value (this process can be done automatically using a feedback loop). Other methods for providing the control signals can be used without departing from the scope of the present teachings.

Key to this approach is the way the current I can be adjusted. The mechanism is simply that the resistance between point A and point B is varied by selectively switching in a set of weighted (e.g. binary) resistors ($R_a$, $R_b$, . . . , $R_m$) across R2. So, in the broadest sense, the current I can be varied by changing which NMOS switches are on and which are off, since as the resistance of the sum of R1+$R_{EQ}$+R3 varies, where $R_{EQ}$ is the resistance of the resistive network 42', so does I vary. The following design approach is given to aid in the understanding of how the circuit works.

First, consider the contribution of the 'on' resistance of the NMOS switches ($M_1$, $M_2$, . . . , $M_m$). Since the voltage across these switches will be very low, they will be operating in their linear region. Their resistance will be added to $R_a$, $R_b$, etc. This is easily understood; however, it is important to keep the current density in each of the NMOS cells constant so that they will track over temperature and other process variations. This can be done by paralleling the required number of NMOS cells according to their respective position in the binary network. For example, in a 4-bit binary network, the LSB resistor $R_a$, having a resistance R, would be switched with 8 NMOS switches; the LSB+1 resistor $R_b$, having a resistance 2R, would be switched with 4 NMOS switches; the LSB+2 resistor $R_c$ having a resistance 4R, would be switched with 2 NMOS switches; and the LSB+3 resistor $R_d$, having a resistance 8R, would be switched with 1 NMOS switch. Thus, the number of transistors used to implement each switch ($M_1$, $M_2$, . . . , $M_M$) is determined by the weight of the resistor that the switch is coupled to. By paralleling the NMOS switches, the contribution of each switch's error is kept constant and smaller than the appropriate LSB.

As an example, suppose the current I is desired to be equal to 1.0 mA, and assume that the resistors $R_{TOT}$=R1+R2+R3 can be fabricated within a +/−0.5% tolerance and $R_{TOT}$ is approximately 4000 Ω. Assuming $V_E$=4.0 V, the resistance between nodes A and B needs to be adjusted by a range of 4000×0.005 or +/−20 Ω.

Further assume that the current needs to be adjustable to an accuracy of 13 bits. This is one part in 8192 or 0.0122%. This would require an adjustment to the resistor bank 44' of an LSB (least significant bit) of approximately 0.48 Ω. Since the desired adjustment range is +/−20 Ω or 40 Ω, each resolution step needs to be less than 0.48 ohm. This means that the binary ladder 44' must have at least 40/0.48=83 steps.

Let R2=200 Ω. The LSB sizes will be non-linear over the range of 200 to approximately 160 Ω because of the fixed value of R2. Therefore, select the binary resistor network to have 8 bits. The resistor values are chosen so that they will be binarily weighted, i.e. $R_a$=1 k Ω, $R_b$=2 k Ω, . . . , $R_h$=128K Ω. With all the NMOS switches turned on, the resistance $R_{EQ}$ between points A and B is equal to R2 in parallel with $R_a$ in parallel with $R_b$ in parallel with $R_c$, . . . , in parallel with $R_h$. Since R2=200 Ω, this is:

$$R_{EQ} = \frac{1}{\frac{1}{200} + \frac{1}{1000} + \frac{1}{2000} + \ldots + \frac{1}{128000}} = 143\ \Omega \quad [2]$$

When all the switches are in the open state, the resistance between nodes A and B is equal to R2, or 200 Ω. Therefore, if R1+R3=4000−(200+143)/2=3828 Ω (a reasonable value for R3=50 Ω), the total resistance of R1+$R_{EQ}$+R3 can be adjusted from 3828+200=4028 Ω to 3828+143=3971 Ω, a +/−28 Ω range on either side of 4000 Ω. The goal of adjusting over +/−20 Ω has therefore been met.

The LSB step size should then be calculated to ensure that it is less than 0.48 Ω. The largest LSB step will be taken when all switches are off and then the LSB is switched on. The resistance from point A to point B will switch from 200 Ω in parallel with 128000 Ω, which equals 199.687 Ω, an LSB size of 0.31 Ω. This meets the desired objective.

Thus, the current I can be adjusted to the design value with the range and resolution required. The above design analysis is certainly not the only way this design could be approached. It is offered as a way to see how the circuit will function.

This approach, while satisfying all of the design requirements, utilizes many individual resistors. In fact, for $R_a$=1 k Ω through $R_h$=128K Ω, assuming the common resistor value of 4 k Ω, the following table (and the many combinations thereof—this is just one example) would apply:

$R_a$=4 resistors in parallel
$R_b$=2 resistors in parallel
$R_c$=1 resistor
$R_d$=2 resistors in series
$R_e$=4 resistors in series
$R_f$=8 resistors in series
$R_g$=16 resistors in series
$R_h$=32 resistors in series This results in a total of 69 resistors.

These resistors take a significant area on the die and it would be helpful if fewer resistors could be used to provide the same range of adjustment. This leads to an improved implementation.

In the embodiments shown in FIGS. 5 and 6, the resistive network 42 is comprised of a plurality of resistors in parallel. This is the simplest way to implement the resistive network 42; however, it is not the only, or most efficient, approach. The resistors in the network 42 can be connected in many other ways without departing from the teachings of the present invention. One alternative implementation is shown in FIG. 7.

Figure 7:
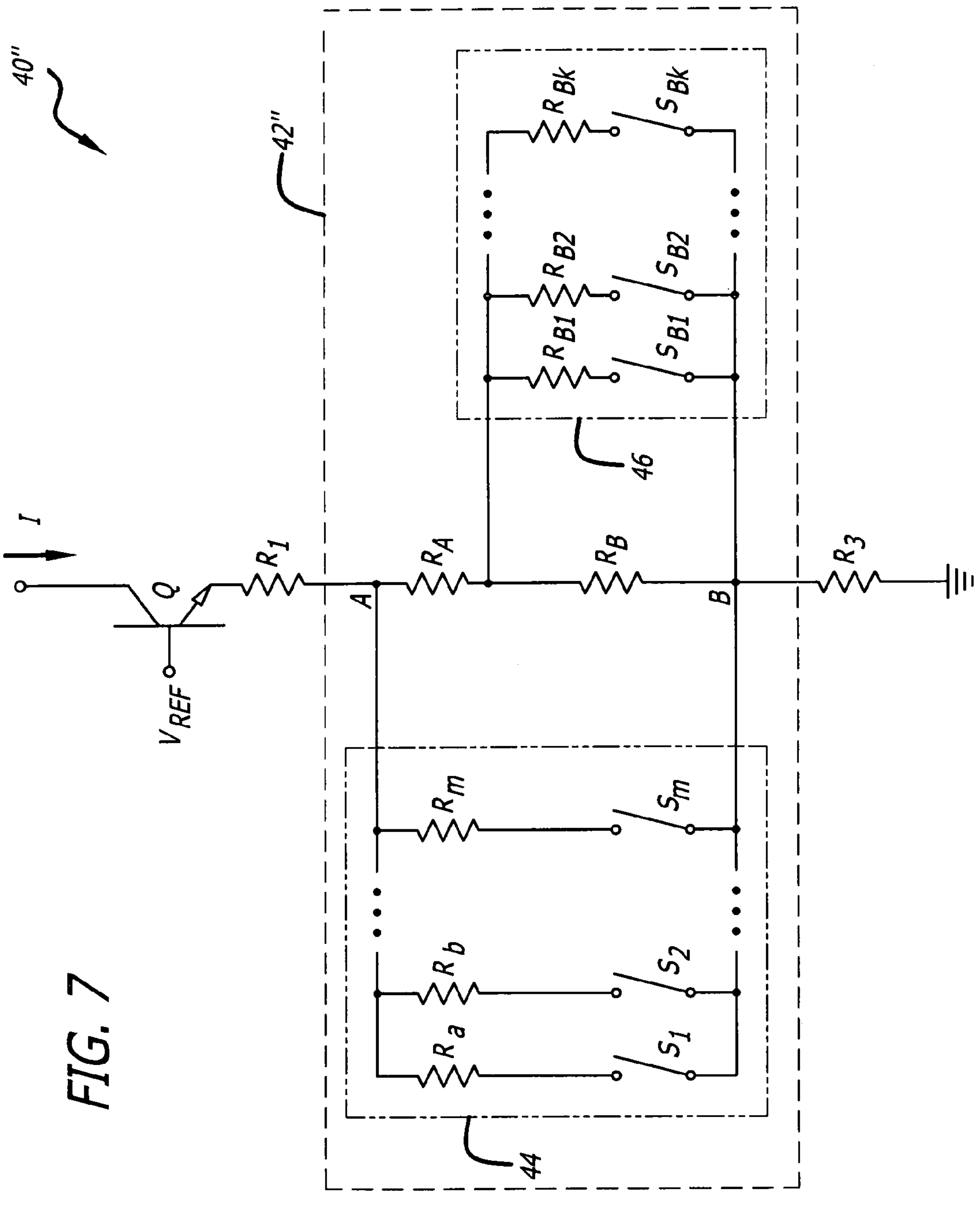
FIG. 7 is a schematic of an implementation of a trimmable current source designed in accordance with an alternative embodiment of the teachings of the present invention.

FIG. 7 is a schematic of an implementation of a trimmable current source 40" designed in accordance with an alternative embodiment of the teachings of the present invention. This embodiment is similar to that shown in FIG. 6, except the resistive network 42" includes two banks 44 and 46 of switchable resistors. The resistor R2 of FIG. 6 is replaced with two resistors $R_A$ and $R_B$ connected in series between R1 and R3 (between nodes A and B). A first bank of resistors 44 is connected in parallel between nodes A and B (across both resistors $R_A$ and $R_B$), and a second bank of resistors 46 is connected in parallel to $R_B$. The first bank of resistors 44 includes a first plurality of resistors ($R_a$, $R_b$, . . . , $R_m$) connected in parallel between nodes A and B, and a first plurality of switches ($S_1$, $S_2$, . . . , $S_m$), each switch coupled to one of the resistors ($R_a$, $R_b$, . . . , $R_m$, respectively). The switches ($S_1$, $S_2$, . . . , $S_m$) selectively switch the resistors ($R_a$, $R_b$, . . . , $R_m$) in and out of the resistive network 42" in accordance with a control signal. Similarly, the second bank of resistors 46 includes a second plurality of resistors ($R_{B1}$, $R_{B2}$, . . . , $R_{Bk}$) connected in parallel across $R_B$, and a second plurality of switches ($S_{B1}$, $S_{B2}$, . . . , $S_{Bk}$), each switch coupled to one of the resistors ($R_{B1}$, $R_{B2}$, . . . , $R_{Bk}$, respectively). The switches ($S_{B1}$, $S_{B2}$, . . . , $S_{Bk}$) selectively switch the resistors ($R_{B1}$, $R_{B2}$, . . . $R_{Bk}$) in and out of the resistive network 42" in accordance with a control signal.

In general, the resistive network 42" may include any number of resistors $R_A$, $R_B$, . . . $R_L$, connected in series between node A and node B, and one or more resistor, banks (44, 46), each bank including a plurality of switchable resistors, and connected in parallel across one or more of the series resistors $R_A$, $R_B$, . . . $R_L$.

The implementation of FIG. 7 can achieve the same design goals using a fewer number of resistors than the implementation of FIG. 6. Consider the same numerical example given for FIG. 6. The design goal was to be able to adjust the total resistance R1+$R_{EQ}$+R3 over a range of +/−20 Ω with an LSB of less than 0.48 Ω. Let the first resistor bank 44 be comprised of four resistors: $R_a$=1 k Ω, $R_b$=2 k Ω, $R_c$=4 k Ω, and $R_d$=8 k Ω, and let the second resistor bank 46 be comprised of four resistors: $R_{B1}$=1 k Ω, $R_{B2}$=2 k Ω, $R_{B3}$=4 k Ω, and $R_{B4}$=8 k Ω. For $R_A$+$R_B$=200 Ω, the first resistor bank 44 will switch the resistance between nodes A and B from 200 Ω to 145 Ω. This will satisfy the first requirement to switch over a range of 40 Ω.

The next step will be to ensure that two additional criteria are met by the second resistor bank 46. First, the LSB must switch in steps of less than 0.48 Ω. Secondly, the range of the second resistor bank 46 must extend over the largest LSB swing of the first resistor bank 44, which is equal to 200 Ω−(200 Ω in parallel with 8000 Ω)=4.87 Ω. These two conditions are satisfied in the selection of $R_B$.

First, $R_B$ in parallel with 8000 Ω must be greater than $R_B$−0.48 Ω. Thus:

$$\frac{8000\,R_B}{R_B+8000} > R_B - 0.48\ \Omega \qquad [3]$$

$$R_B^2 - 0.48R_B < 3840_{\Omega} \qquad [4]$$

$$R_B < 62_{\Omega} \qquad [5]$$

Second, $R_B$ in parallel with 533 Ω (the total resistance of the second resistor bank 46 with all the switches on) must be less than $R_B$−4.87 Ω:

$$\frac{533\,R_B}{R_B+533} < R_B - 4.87\,\Omega \qquad [6]$$

$$R_B^2 - 4.87R_B > 2596_{\Omega} \qquad [7]$$

$$R_B > 54_{\Omega} \qquad [8]$$

Therefore, if $R_B$ is between 54 Ω and 62 Ω, it will meet both criteria and the resistive network 42" shown in FIG. 7 will work in place of the 8-bit binary network 42' previously discussed for FIG. 6. The total number of individual resistors required in this one example of many possible, again assuming the common resistor value of 4 k Ω, is given by:

$R_B$=1 Resistor
Network 44=9 Resistors
Network 46=9 Resistors

This results in a total of 19 resistors, compared to 69 resistors in the previous example.

This is a significant savings in chip area with no degradation in performance.

Figure 8:
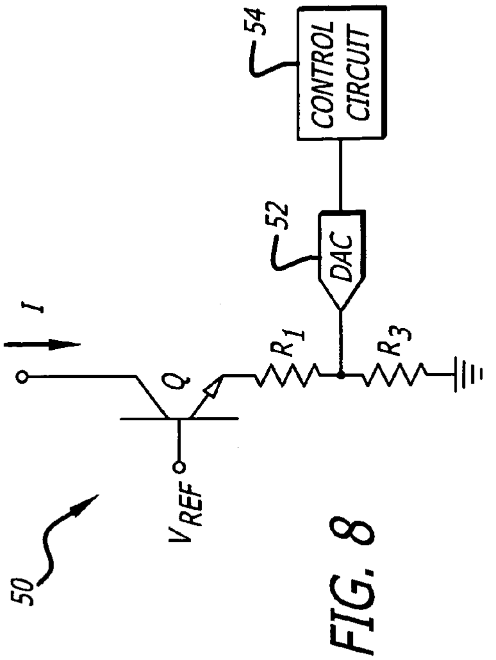
FIG. 8 is a schematic of another implementation of a trimmable current source designed in accordance with an alternative embodiment of the teachings of the present invention.

FIG. 8 is a schematic of another implementation of a trimmable current source 50 designed in accordance with an alternative embodiment of the teachings of the present invention. This improvement is also designed to minimize space on the die. In the embodiments of FIGS. 6 and 7, the current source 40 includes a digitally trimmable resistive network 42 connected in series between two resistors R1 and R3, and a transistor Q adapted to apply a voltage across the resistor chain. The current I is thus adjusted by changing the resistance between R1 and R3 through a plurality of digitally controlled switches. In the embodiment of FIG. 8, the current I is adjusted by adding a voltage or a current between resistors R1 and R3 instead of adding the resistive network 42.

As shown in FIG. 8, the current source 50 includes a transistor Q that draws a current I at its collector, and has a reference voltage $V_{REF}$ applied to its base, generating a voltage $V_E$ at the emitter. The emitter of Q is connected to a resistor R1, which is connected in series to a resistor R3, the other end of which is connected to ground. A DAC 52 applies a voltage or current to the node between R1 and R3 in response to a digital control signal provided by a circuit 54. The control signal can be supplied in a variety of ways, such as using a register as described above in the implementation of FIG. 6.

The DAC 52 could either be a voltage or a current output DAC: either type can be used to adjust the current I. Without the DAC 52, the current I is approximately given by: $I=V_{REF}/(R1+R3)$. This is because R3 is connected to ground. If the DAC 52 changes the voltage at the node between R1 and R3, this will change the current I. For example, if the DAC 52 changes the voltage at that node to 0 V, then the current I would become $I=V_{REF}/R1$. As the output of the DAC 52 becomes more negative, the voltage drop across R1 gets larger and the current I gets larger. If the output of the DAC 52 becomes more positive, then the voltage drop across R1 gets smaller and the current I gets smaller. Thus, the current I generated by the current source 50 can be adjusted by controlling the DAC 52.

As a numerical example, consider a voltage trim DAC implementation, R1 is targeted for 3950 Ω and R3=50 Ω. With a 1% variation of R1, the trim DAC 52 can be designed to output between 10 and 90 mV. This would cover the expected 1% range of resistor variance. With a current trim DAC implementation, change the R1 target to 3900 Ω+/−40 Ω. Then the trim DAC 52 could be unipolar, always sourcing current and its range would be 0.198 mA to 1.82 mA. R3 would remain at 50 Ω. The resolution of either trim DAC 52 would be set by the desired resolution required of the DAC cell 12. The DAC 52 could be designed so that temperature, variations would not affect the accuracy of the trim because the same reference current circuits are used in the DAC trim 52 and for the LSB current. An equally important benefit of this approach would be that the DAC 52 could be made without resistors, utilizing instead current-setting transistors. This would use very little chip area.

All of the implementations described allow for adjustments of I to create matching current sources in a DAC. Key to this approach is that while the adjustments are made digitally, they are all made outside of the switching signal paths and, therefore, do not cause any degradation of the primary DAC's settling time or speed of conversion. While the invention has been described for use in DAC cells, it could be adapted for use in other applications without departing from the scope of the present invention.

Thus, the present invention has been described herein with reference to a particular embodiment for a particular application. Those having ordinary skill in the art and access to the present teachings will recognized additional modifications, applications and embodiments within the scope thereof.

It is therefore intended by the appended claims to cover any and all such applications, modifications and embodiments within the scope of the present invention.

Accordingly,

What is claimed is:

1. A current source comprising:

first means for generating a current in response to an applied voltage and a resistance variable in response to a control signal; and second means for supplying said control signal, wherein said first means includes a resistive network comprising a first plurality of resistors $R_a$, $R_b$, . . . , $R_m$, wherein said first plurality of resistors $R_a$, $R_b$, . . . , $R_m$ are connected in parallel across a first node A and a second node B, and wherein said resistive network further includes two resistors $R_A$ and $R_B$ connected in series between node A and node B.

2. The invention of claims 1, wherein said resistive network further includes a first plurality of switches $S_1$, $S_2$, . . . $S_m$, each switch coupled to one of said first plurality of resistors $R_a$, $R_b$, . . . , $R_m$ and adapted to switch said resistor in and out of said resistive network in response to said control signal.

3. The invention of claim 2 wherein said control signal is a digital word comprised of m bits.

4. The invention of claim 3 wherein each bit of said control signal controls one of said switches $S_1$, $S_2$, . . . $S_m$.

5. The invention of claim 2 wherein said switches are implemented using transistors.

6. The invention of claim 5 wherein said switches are implemented using NMOS transistors.

7. The invention of claim 5 wherein the number of transistors used to implement each switch is determined by the weight of the resistor that the switch is coupled to.

8. The invention of claim 5 wherein said switches are controlled by control signals applied to the gates of said transistors.

9. The invention of claim 1, wherein said first plurality of resistors $R_a$, $R_b$, . . . , $R_m$ are binarily weighted.

10. The invention of claim 1, wherein said resistive network further includes a resistor R2 connected between node A and node B.

11. The invention of claim 1 wherein said resistive network further includes a second plurality of resistors $R_{B1}$, $R_{B2}$, . . . , $R_{Bk}$.

12. The invention of claim 11 wherein said second plurality of resistors $R_{B1}$, $R_{B2}$, . . . , $R_{Bk}$ are connected in parallel across resistor $R_B$.

13. The invention of claim 12 wherein said resistive network further includes a second plurality of switches $S_{B1}$, $S_{B2}$, . . . $S_{Bk}$, each switch coupled to one of said second plurality of resistors $R_{B1}$, $R_{B2}$, . . . , $R_{Bk}$ and adapted to switch said resistor in and out of said resistive network in response to said control signal.

14. A current source comprising:

first means for generating a current in response to an applied voltage and a resistance variable in response to a control signal; and second means for supplying said control signal, wherein said first means includes a resistive network comprising a first plurality of resistors $R_a$, $R_b$, . . . , $R_m$, wherein said first plurality of resistors $R_a$, $R_b$, . . . , $R_m$ are connected in parallel across a first node A and a second node B, and wherein said resistive network further includes a third plurality of resistors $R_A$, $R_B$, . . . $R_L$ connected in series between node A and node B.

15. The invention of claim 14 wherein said resistive network further includes one or more resistor banks, each resistor bank including a number of resistors $R_{B1}$, $R_{B2}$, . . . , $R_{Bk}$.

16. The invention of claim 15 wherein said resistor banks are each connected in parallel across one or more of said third plurality of resistors $R_A$, $R_B$, . . . $R_L$.

17. The invention of claim 16 wherein said resistors $R_{B1}$, $R_{B2}$, . . . , $R_{Bk}$ of said resistor banks are connected in parallel.

18. The invention of claim 17 wherein each of said resistor banks further includes a number of switches $S_{B1}$, $S_{B2}$, . . . $S_{Bk}$, each switch coupled to one of said resistors $R_{B1}$, $R_{B2}$, . . . , $R_{Bk}$ and adapted to switch said resistor in and out of said resistive network in response to said control signal.

19. The invention of claim 1 or 14 wherein said first means further includes a transistor Q adapted to apply a voltage across said resistive network to generate a current I.

20. The invention of claim 19 wherein a reference voltage $V_{REF}$ is applied to the base of said transistor Q.

21. The invention of claim 19 wherein said current I is output from the collector of said transistor Q.

22. A current source comprising:

two resistors R1 and R3 connected in series;

first means for applying a voltage across said resistors R1 and R3 to generate a current I, wherein said first means includes a transistor Q, and;

a digital to analog converter (DAC) adapted to apply a voltage or current at the node between said resistors R1 and R3 to change the current I in response to a control signal input to said DAC; and second means for supplying said control signal, wherein said current I is output from the collector of said transistor Q.

23. A current source comprising:

two resistors R1 and R3 connected in series;

first means for applying a voltage across said resistors R1 and R3 to generate a current I, wherein said first means includes a transistor Q, and;

a digital to analog converter (DAC) adapted to apply a voltage or current at the node between said resistors R1 and R3 to change the current I in response to a control signal input to said DAC; and second means for supplying said control signal, wherein said resistor R1 is coupled to the emitter of said transistor Q.

24. A current source comprising:

two resistors R1 and R3 connected in series;

first means for applying a voltage across said resistors R1 and R3 to generate a current I, wherein said first means includes a transistor Q, and;

a digital to analog converter (DAC) adapted to apply a voltage or current at the node between said resistors R1 and R3 to change the current I in response to a control signal input to said DAC; and second means for supplying said control signal, wherein said resistor R3 is connected ground.

25. The invention of claim 22, 23, or 24 wherein said DAC is a voltage output DAC adapted to change the voltage at said node between R1 and R3.

26. The invention of claim 22, 23, or 24 wherein said DAC is a current output DAC adapted to add a current at said node between R1 and R3.

27. The invention of claim 22, 23, or 24 wherein a reference voltage $V_{REF}$ is applied to the base of said transistor Q.

28. A current source comprising:

a transistor Q adapted to receive a voltage $V_{REF}$ at its base and output a current I at its collector;

a resistor R1 connected to the emitter of transistor Q;

a resistor R3 having one end connected in series to R1 and the other end connected to ground;

a digital to analog converter (DAC) adapted to apply a voltage or current at the node between said resistors R1 and R3 to change the current I in response to a control signal input to said DAC; and a circuit for supplying said control signal.

29. A digital to analog converter comprising:

a first current summing bus;

a second current summing bus; and a plurality of current steering cells, each cell including:

a current source comprising:

a transistor Q adapted to receive a voltage $V_{REF}$ at its base and output a current I at its collector;

a resistor R1 connected to the emitter of transistor Q;

a resistor R3 having one end connected in series to R1 and the other end connected to ground;

a digital to analog converter (DAC) adapted to apply a voltage or current at the node between said resistors R1 and R3 to change the current I in response to a control signal input to said DAC; and a circuit for supplying said control signal; and a pair of transistors for selectively switching current from said current source between said first current summing bus and said second current summing bus in response to an input signal.

* * * * *